US008294259B2

(12) United States Patent
Jiang et al.

(10) Patent No.: US 8,294,259 B2
(45) Date of Patent: Oct. 23, 2012

(54) INTERCONNECT PATTERN FOR TRANSCEIVER PACKAGE

(75) Inventors: Xiaohong Jiang, San Jose, CA (US); Hong Shi, Fremont, CA (US)

(73) Assignee: Altera Corporation, San Jose, CA (US)

( * ) Notice: Subject to any disclaimer, the term of this patent is extended or adjusted under 35 U.S.C. 154(b) by 198 days.

(21) Appl. No.: 12/702,789

(22) Filed: Feb. 9, 2010

(65) Prior Publication Data
US 2011/0193233 A1 Aug. 11, 2011

(51) Int. Cl.
*H01L 23/48* (2006.01)
(52) U.S. Cl. .......... 257/697; 257/773; 257/780
(58) Field of Classification Search .......... 257/697
See application file for complete search history.

(56) References Cited

U.S. PATENT DOCUMENTS

| | | |
|---|---|---|
| 6,762,366 B1 | 7/2004 | Miller et al. |
| 7,347,701 B2 | 3/2008 | Daly et al. |
| 7,405,477 B1 | 7/2008 | Tao et al. |
| 2005/0184390 A1 | 8/2005 | Gagne et al. |
| 2009/0289348 A1* | 11/2009 | Tang et al. .......... 257/697 |

* cited by examiner

*Primary Examiner* — Thien F Tran
(74) *Attorney, Agent, or Firm* — Ward & Zinna, LLC

(57) ABSTRACT

In one embodiment, signaling and ground contacts are located in at least two parallel, rectilinear rows along at least one edge of an interconnect package such as a BGA package. In one row, each of a plurality of ground contacts is located between two pairs of contacts for receiving differential signals. In the second row, each of a plurality of ground contacts is located between two pairs of contacts for transmitting differential signals and the ground contacts in the second row are offset by one column from the ground contacts in the first row. As a result, the ratio of signaling pairs to ground contacts is 2:2. Additional pairs of rows may also be used. In other embodiments, signaling and ground contacts are located in three parallel, rectilinear rows along at least one edge of the package.

16 Claims, 3 Drawing Sheets

INTERCONNECT PATTERN FOR TRANSCEIVER PACKAGE

BACKGROUND OF THE INVENTION

This relates to package design and more particularly to patterns of electrical interconnects that are used for high performance devices such as high speed differential signaling transceiver pairs and memory interfaces. As is known in the art, such interfaces are typically implemented using a ball grid array (BGA) or a pin grid array (PGA) A BGA is an area array of solder balls or solder bumps that is located on the surface of a package. A PGA is an area array of pins underneath a package surface. The BGA or PGA is used to connect the package to the next level of package. See, R. R. Tummala, *Fundamentals of Microsystems Packaging*, pp. 67, 68, 279-281, 680-682, 925 (McGraw-Hill, 2001), which is incorporated by reference herein in its entirety. For convenience, the term "contacts"or "interconnects" will be used hereafter to refer to solder balls, solder bumps and interconnect pins as well as similar connectors.

In designing high speed differential signaling interfaces, it is important to achieve nominal differential impedance and good isolation between the high speed differential signaling interconnects. The practice has been to use as many ground contacts as possible to surround each pair of high speed differential signaling contacts. This, however, results in the use of large numbers of ground contacts, leading to consequences such as the need for trade-offs between the number of ground contacts and the number of I/O contacts, trade-offs in the number of ground contacts versus performance, and/or increases in the size of the interconnect package.

FIGS. 1A and 1B depict two interconnect arrangements in which each differential signaling pair is surrounded by ground contacts. As shown in FIG. 1A, a rectilinear array 100 of contacts comprises ground contacts 102, pairs of differential signal receiving contacts 104 and pairs of differential signal transmitting contacts 106 extending along an edge 110 of an interconnect package. As will be apparent, each differential pair of contacts 104 or 106 is surrounded by ten ground contacts 102. The pattern shown in FIG. 1A is a repeating pattern that is made by stepping and repeating the pattern of twelve contacts defined by rectangular box 108. As will be apparent, the rectangular box contains two pairs of signaling contacts 104, 106 and eight ground contacts for a signaling to ground ratio of 2:8.

As shown in FIG. 1B, a rectilinear array 120 of contacts comprises ground contacts 122, pairs of differential signal receiving contacts 124 and pairs of differential signal transmitting contacts 126 extending along an edge 130 of a BGA package. As will be apparent, each differential pair of contacts 124 or 126 is surrounded by six ground contacts 122. The pattern shown in FIG. 1B is a repeating pattern that is made by stepping and repeating the pattern of eight contacts defined by rectangular box 128. As will be apparent, the rectangular box contains two pairs of signaling contacts 124, 126 and four ground contacts 122 for a signaling to ground ratio of 2:4. This reduction in the number of grounds contacts by 50% is achieved with very little impact on either the differential impedance or the coupling coefficient.

Efforts at further reduction in the number of ground contacts have not been as successful. FIG. 1C depicts one such effort in which a rectilinear array 140 of contacts comprises ground contacts 142, pairs of differential signal receiving contacts 144 and pairs of differential signal transmitting contacts 146 extending along an edge 150 of an interconnect package. The pattern shown in FIG. 1C is a repeating pattern that is made by stepping and repeating the pattern of twelve contacts defined by the parallelogram 148. As will be apparent, the parallelogram contains four pairs of signaling contacts 144, 146 and four ground contacts for a signaling to ground ratio of 2:2. In some implementations, the two ground contacts in the row immediately adjacent edge 150 are not present in order to improve access to signal transmitting contacts 146. While the pattern of FIG. 1C has achieved an additional reduction of 50% in the number of ground contacts, it comes at a cost. Circuit simulations indicate that the differential impedance of the pattern with two ground contacts increases about 10% and the coupling coefficient is about 15× higher than that of the pattern of FIG. 1A.

SUMMARY OF THE INVENTION

The present invention is directed to interconnect patterns with reduced numbers of ground contacts but improved performance relative to prior art patterns.

In one embodiment of the invention, signaling and ground contacts are located in a rectilinear array of rows and columns with at least two parallel rows along at least one edge of an interconnect package such as a BGA package in one row, each of a plurality of ground contacts is located between two pairs of contacts for receiving differential signals. In the second row, each of a plurality of ground contacts is located between two pairs of contacts for transmitting differential signals and the ground contacts in the second row are offset by one column (or contact) from the ground contacts in the first row. Additional pairs of rows may also be used.

In other embodiments of the invention, signaling and ground contacts are located in a rectilinear array of rows and columns with three parallel rows along at least one edge of the package. In the first row, ground contacts alternate with contacts for receiving differential signals and in the second row ground contacts alternate with contacts for transmitting differential signals. The third row of contacts is located between the first and second rows and contains contacts for receiving differential signals that alternate with contacts for transmitting differential signals. In a second embodiment, the ground contacts in the second row are offset by one column (or contact) from the ground contacts in the first row; the receiving contacts in the third row are in the same column as the receiving contacts in the first row; and the transmitting contacts in the third row are in the same column as the transmitting contacts in the second row. Each pair of contacts for receiving differential signals is formed by a contact in the first row and a contact in the third row that is in the same column as the contact in the first row and each pair of contacts for transmitting differential signals is formed by a contact in the second row and a contact in the third row that is in the same column as the contact in the second row.

In a third embodiment, the ground contacts in the second row are offset by one column (or contact) from the ground contacts in the first row; the receiving contacts in the third row are offset by one column (or contact) from the receiving contacts in the first row; and the transmitting contacts in the third row are offset by one column (or contact) from the transmitting contacts in the second row. Each pair of contacts for receiving differential signals is formed by a contact in the first row and a contact in the third row that is offset by one column (or contact) from the contact in the first row and each pair of contacts for transmitting differential signals is formed by a contact in the second row and a contact in the third row that is offset by one column (or contact) from the contact in the second row.

BRIEF DESCRIPTION OF THE DRAWINGS

These and other objects, features and advantages of the present invention will be more readily apparent from the following Detailed Description in which.

DETAILED DESCRIPTION

Figure 2:
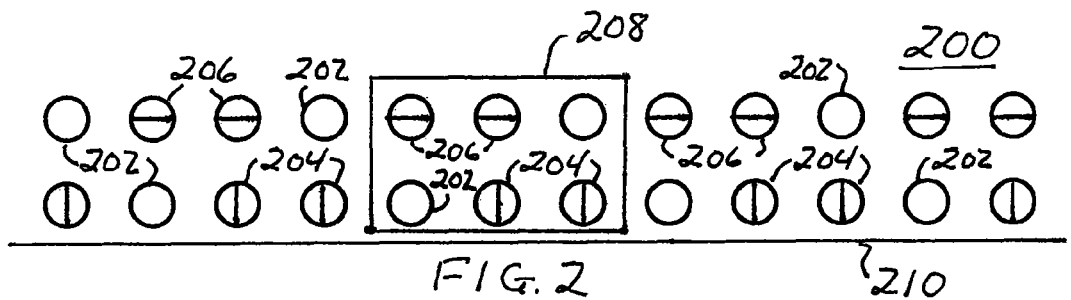
FIG. 2 depicts a first embodiment of the invention.

FIG. 2 depicts a rectilinear array 200 of rows and columns of contacts arranged in two parallel rows of contacts comprising ground contacts 202, pairs of differential signal receiving contacts 204, and pairs of differential signal transmitting contacts 206 extending along an edge 210 of an interconnect package. In one row, each of a plurality of ground contacts 204 is located between two pairs of contacts 204 for receiving differential signals. In the second row, each of a plurality of ground contacts 202 is located between two pairs of contacts 206 for transmitting differential signals and the ground contacts in the second row are offset by one column (or contact) from the ground contacts in the first row. While FIG. 2 illustrates the invention with the row containing the signal receiving contacts 204 closer to edge 210, the invention may also be practiced with the row containing the signal transmitting contacts 206 closer to edge 210.

The pattern shown in FIG. 2 is a repeating pattern that is made by stepping and repeating the pattern of six contacts defined by rectangular box 208. As will be apparent, the rectangular box contains two pairs of signaling contacts 204, 206 and two ground contacts 202 for a signaling to ground ratio of 2:2.

The pattern of FIG. 2 may also be repeated over additional rows. For example, a rectilinear array of rows and columns of contacts may be arranged in four parallel rows of contacts comprising ground contacts, pairs of differential signal receiving contacts, and pairs of differential signal transmitting contacts extending along an edge of an interconnect package. The first two rows of such an array would be the same as the two rows of FIG. 2; and the second two rows would be the same as the first two rows and aligned with them. This pattern would also be made by stepping and repeating the pattern of six contacts defined by rectangular box 208.

Figure 3:
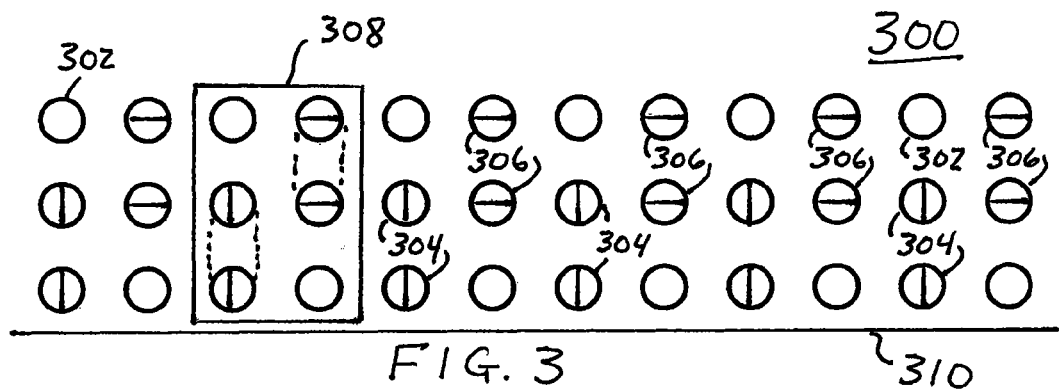
FIG. 3 depicts a second embodiment of the invention.

FIG. 3 depicts a rectilinear array 300 of rows and columns of contacts arranged in three parallel rows of contacts comprising ground contacts 302, pairs of differential signal receiving contacts 304, and pairs of differential signal transmitting contacts 306 extending along an edge 310 of an interconnect package. In the first row, ground contacts 302 alternate with contacts 304 for receiving differential signals; and in the second row, ground contacts alternate with contacts 306 for transmitting differential signals. The third row of contacts is located between the first and second rows and contains contacts 304 for receiving differential signals that alternate with contacts 306 for transmitting differential signals. The ground contacts 302 in the second row are offset by one column (or contact) from the ground contacts 302 in the first row; the receiving contacts 304 in the third row are in the same column as the receiving contacts in the first row; and the transmitting contacts 306 in the third row are in the same column as the transmitting contacts in the second row. Each pair of contacts for receiving differential signals is formed by a receiving contact 304 in the first row and a receiving contact 304 in the third row that is in the same column as the contact in the first row; and each pair of contacts for transmitting differential signals is formed by a transmitting contact 306 in the third row that is in the same column as a transmitting contact 306 in the second row. While FIG. 3 illustrates the invention with the row containing signal receiving contacts 304 closest to edge 310, the invention may also be practiced with the row containing signal transmitting contacts 306 closest to edge 310.

The pattern shown in FIG. 3 is a repeating pattern that is made by stepping and repeating the pattern of six contacts defined by box 308. As will be apparent, the box contains two pairs of signaling contacts 304, 306 and two ground contacts 302 for a signaling to ground ratio of 2:2.

Figure 4:
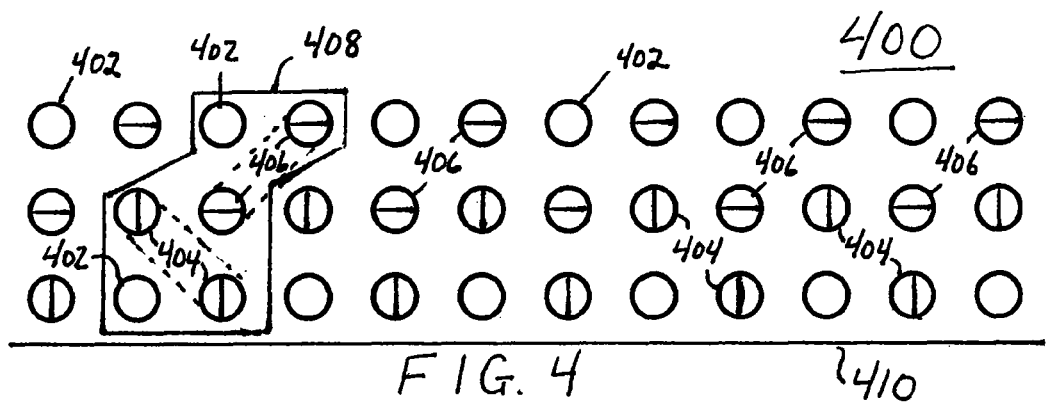
FIG. 4 depicts a third embodiment of the invention.

FIG. 4 depicts a rectilinear array 400 of rows and columns of contacts arranged in three parallel rows of contacts comprising ground contacts 402, pairs of differential signal receiving contacts 404, and pairs of differential signal transmitting contacts 406 extending along an edge 410 of an interconnect package. In the first row, ground contacts 402 alternate with contacts 404 for receiving differential signals; and in the second row, ground contacts 402 alternate with contacts 406 for transmitting differential signals. The third row of contacts is located between the first and second rows and contains contacts 404 for receiving differential signals that alternate with contacts 406 for transmitting differential signals. The ground contacts 402 in the second row are offset by one column (or contact) from the ground contacts 402 in the first row; the receiving contacts 404 in the third row are offset by one column (or contact) from the receiving contacts in the first row; and the transmitting contacts 406 in the third row are offset by one column (or contact) from the transmitting contacts in the second row. Each pair of contacts for receiving differential signals is formed by a receiving contact 404 in the first row and a receiving contact 404 in the third row that is offset by one column (or contact) from the contact in the first row; and each pair of contacts for transmitting differential signals is formed by a transmitting contact 406 in the third row that is offset by one column (or contact) from a transmitting contact 406 in the second row. While FIG. 4 illustrates the invention with the row containing signal receiving contacts 404 closest to edge 410, the invention may also be practiced with the row containing signal transmitting contacts 406 closest to edge 410.

The pattern shown in FIG. 4 is a repeating pattern that is made by stepping and repeating the pattern of six contacts defined by box 408. As will be apparent, the box contains two pairs of signaling contacts 404, 406 and two ground contacts 402 for a signaling to ground ratio of 2:2.

Figure 1A:
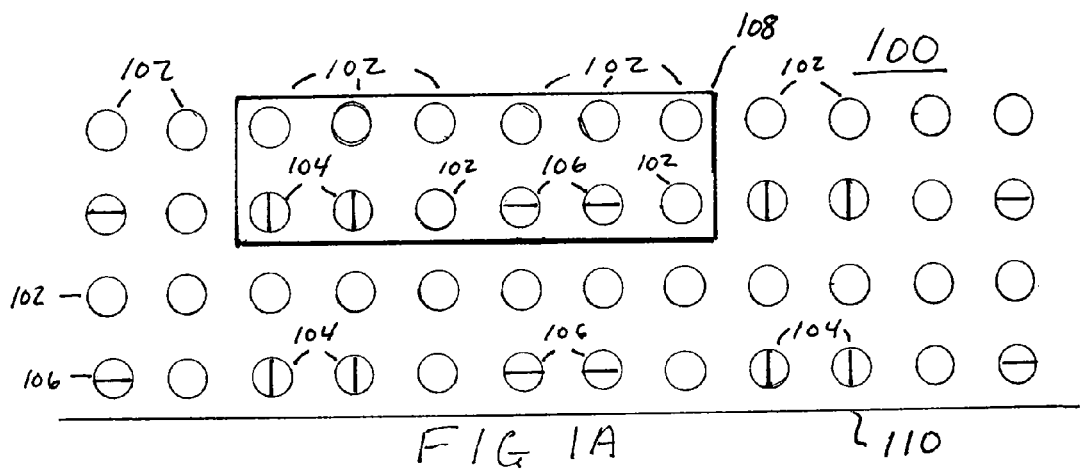
FIGS. 1A-1C depict conventional interconnect patterns for distributing differential round contacts.
Figure 1B:
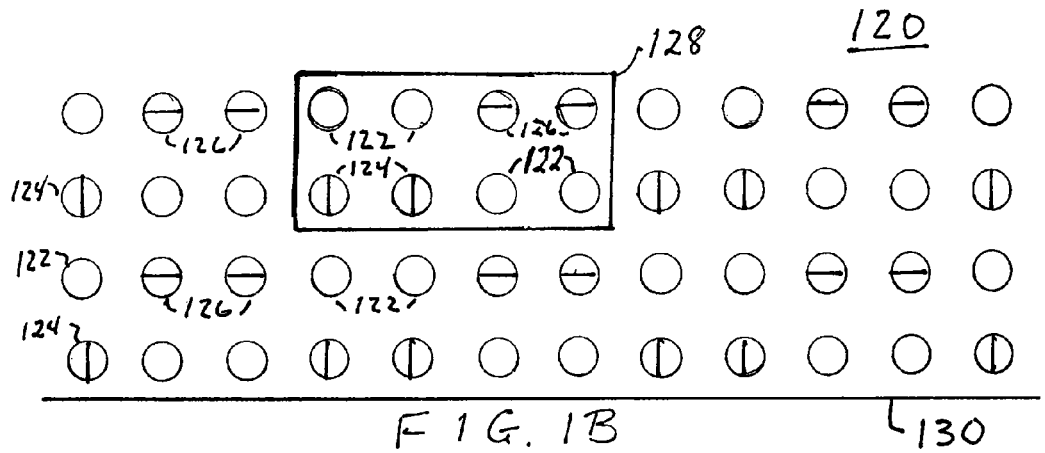
Figure 1C:
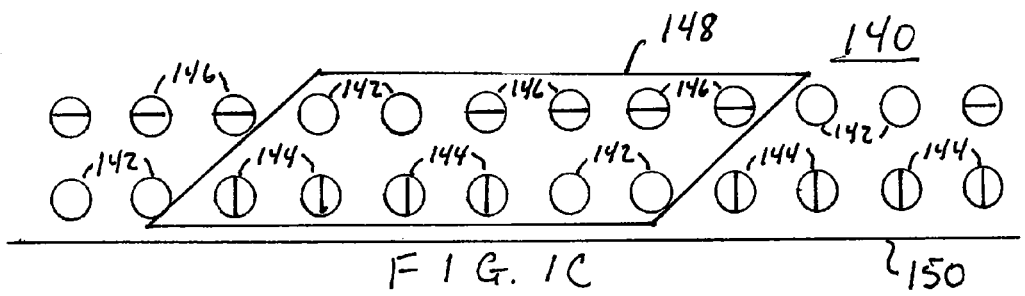
Figure 5A:
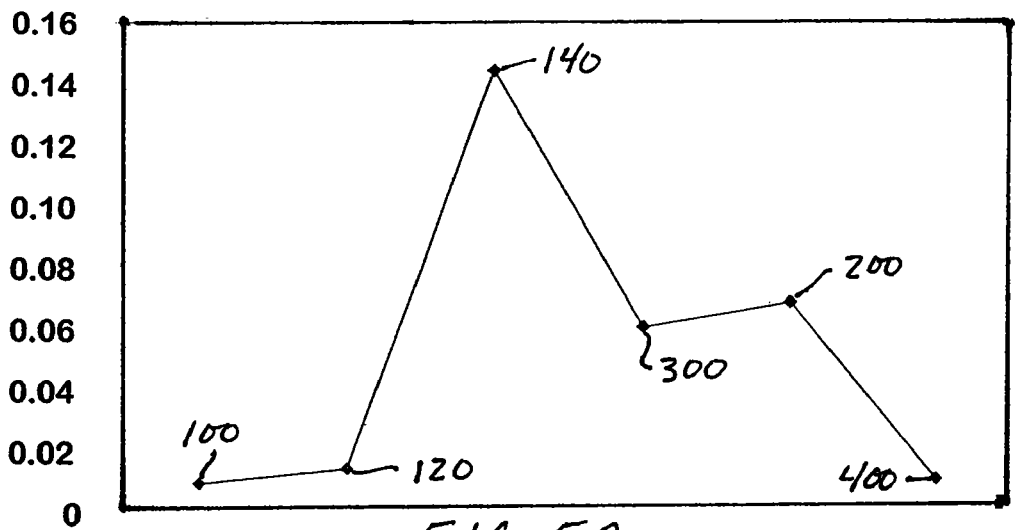
FIGS. 5A and 5B are plots of coupling coefficient and differential impedance for the patterns depicted in FIGS. 1A-1C, 2 and 4.

While the interconnect patterns of FIGS. 2-4 all have signaling to ground ratios that are the same as that of the interconnect pattern of FIG. 1C, the performance of the patterns of FIGS. 2-4 is significantly improved. As shown in FIG. 5A, the coupling coefficients between high speed transceiver pairs have a normalized value of approximately 0.01 for the arrays 100, 120 of FIGS. 1A and 1B; but these values are achieved at a cost of a signaling to ground ration of 2:8 and 2:4, respectively. For the same signaling to ground ration of 2:2, the coupling coefficients between high speed transceiver pairs is approximately 0.15 for array 140 of FIG. 1C, approximately 0.07 for array 200 of FIG. 2, approximately 0.06 for array 300 of FIG. 3 and approximately 0.01 for array 400 of FIG. 4.

Figure 5B:
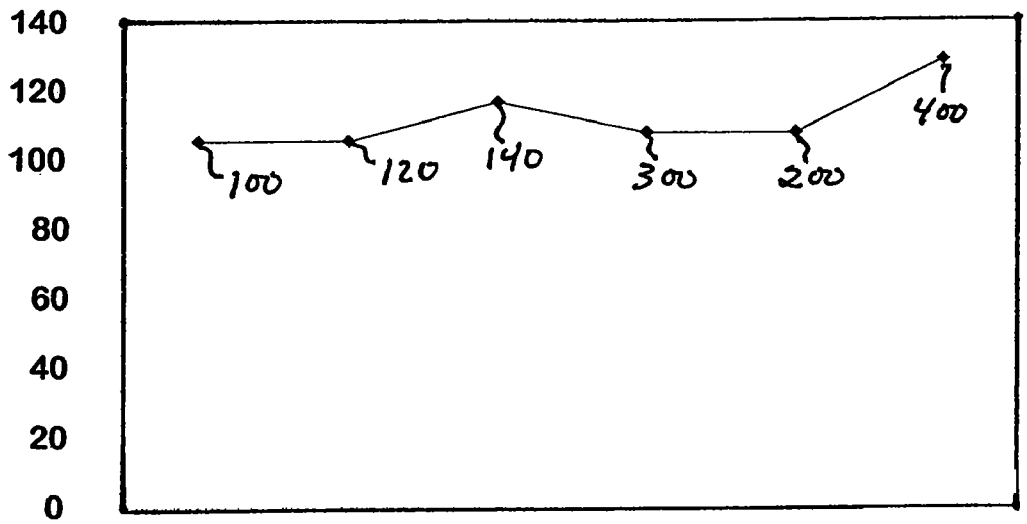

As shown in FIG. 5B, the differential impedances of arrays 200 and 300 of FIGS. 2 and 3 are approximately the same as that of arrays 100, 120 of FIGS. 1A and 1B; and the differential impedance of array 400 of FIG. 4 is only about 25% higher than that of the arrays of FIGS. 1A and 1B but with significantly less use of ground contacts. Thus, array 400 of FIG. 4 has a coupling coefficient that is essentially the same as that of arrays 100, 120 of FIGS. 1A and 1B achieved with only 25% of the number of ground contacts and at a cost of only a 25% increase in the differential impedance. Ordinarily such an increase in differential impedance can be tolerated because it can be used to compensate die pin capacitance.

Where use of array 400 of FIG. 4 is not desired, arrays 200, 300 of FIGS. 2 and 3 also offer attractive alternatives to that of FIG. 1C. While, the arrays of FIGS. 1C, 2 and 3 all offer the same reduction in numbers of ground contacts, the differential impedance of the arrays of FIGS. 2 and 3 is about 15% closer to 100 Ohms than that of the array of FIG. 1C and the coupling coefficient is between 40 and 50% that of the array of FIG. 1C.

As will be apparent to those skilled in the art, numerous variations of the above may be practiced within the spirit and scope of the invention.

What is claimed is:

1. An interconnect package comprising:
   a rectilinear array of rows and columns of contacts comprising:
   a first row of contacts extending along an edge of the package in which each ground contact of a plurality of ground contacts is located between two pairs of contacts for receiving differential signals, and
   a second row of contacts extending along the edge of the package, adjacent and parallel to the first row, in which each ground contact of a plurality of ground contacts is located between two pairs of contacts for transmitting differential signals, the ground contacts in the first row being offset by one column from the ground contacts in the second row and the differential pairs of contacts in the first row being offset by one column from the differential pairs of contacts in the second row.

2. The package of claim 1 further comprising;
   a third row of contacts extending along the edge of the package, parallel to the first row, in which each ground contact of a plurality of ground contacts is located between two pairs of contacts for receiving differential signals and the ground contacts in the third row are in the same columns as the ground contacts in the first row, and
   a fourth row of contacts extending along the edge of the package, parallel to the first row, in which each ground contact of a plurality of ground contacts in the fourth row is located between two pairs of contacts for transmitting differential signals and the ground contacts in the fourth row are in the same columns as the ground contacts in the second row.

3. The package of claim 1 wherein the first row is closer to the edge of the package.

4. The package of claim 1 wherein the second row is closer to the edge of the package.

5. The package of claim 1 wherein the package is a Ball Grid Array package.

6. An interconnect package comprising:
   a rectilinear array of rows and columns of contacts comprising:
   a first row of contacts extending along an edge of the package in which each ground contact of a plurality of ground contacts is located between two contacts, each of which is one of a different pair of contacts for receiving differential signals,
   a second row of contacts extending along the edge of the package, parallel to the first row, in which each ground contact of a plurality of ground contacts is located between two contacts, each of which is one of a pair of contacts for transmitting differential signals, and the ground contacts in the second row are offset by one column from the ground contacts in the first row, and
   a third row of contacts extending along the edge of the package between the first and second rows, in which each contact of a first plurality of contacts for receiving differential signals alternate with a contact of a second plurality of contacts for transmitting differential signals,
   wherein each pair of contacts for receiving differential signals is formed by a contact in the first row and an adjacent contact in the third row and each pair of contacts for transmitting differential signals is formed by a contact in the second row and an adjacent contact in the third row.

7. The package of claim 6 wherein each pair of contacts for receiving differential signals is formed by a contact in the first row and a contact in the third row that are in the same column and each pair of contacts for transmitting differential signals is formed by a contact in the second row and a contact in the third row that are in the same column.

8. The package of claim 6 wherein rach pair of contacts for receiving differential signals is formed by a contact in the first row and a contact in the third row that is offset by one column from the contact in the first row and each pair of contacts for transmitting differential signals is formed by a contact in the second row and a contact in the third row that is offset by one column from the contact in the second row.

9. The package of claim 6 wherein the first row is closest to the edge of the package.

10. The package of claim 6 wherein the second row is closest to the edge of the package.

11. The package of claim 6 wherein the package is a Ball Grid Array package.

12. An interconnect package comprising:
    first and second adjacent, parallel, rectilinear rows of signaling and ground contacts extending along at least one edge of the package,
    in the first row, each ground contact of a plurality of ground contacts being located between two pairs of signaling contacts for receiving differential signals, and
    in the second row, each ground contact of a plurality of ground contacts being located between two pairs of signaling contacts for transmitting differential signals and the ground contacts in the second row being offset by one column from the ground contacts in the first row.

13. The package of claim 12 further comprising third and fourth rectilinear rows of signaling and ground contacts extending parallel to the first and second rows, the third row being the same as the first row and in alignment therewith and the fourth row being the same as the second row and in alignment therewith.

14. The package of claim 12 wherein the first row is closer to the edge of the package.

15. The package of claim 12 wherein the second row is closer to the edge of the package.

16. The package of claim 12 wherein the package is a Ball Grid Array package.

* * * * *